United States Patent [19]

Franke et al.

[11] Patent Number: 6,150,675

[45] Date of Patent: Nov. 21, 2000

[54] SEMICONDUCTOR COMPONENT WITH A CONTROL ELECTRODE FOR MODULATING THE CONDUCTIVITY OF A CHANNEL AREA BY MEANS OF A MAGNETORESISTOR STRUCTURE

[75] Inventors: Torsten Franke, Dresden; Peter Türkes, Unterhaching; Heinrich Brunner, Dorfen; Alfred Porst, Munich, all of Germany

[73] Assignee: Siemens Aktiengesellschaft, Munich, Germany

[21] Appl. No.: 09/214,931

[22] PCT Filed: Jul. 10, 1997

[86] PCT No.: PCT/DE97/01458

§ 371 Date: Jan. 15, 1999

§ 102(e) Date: Jan. 15, 1999

[87] PCT Pub. No.: WO98/02925

PCT Pub. Date: Jan. 22, 1998

[30] Foreign Application Priority Data

Jul. 16, 1996 [DE] Germany ............... 196 28 656

[51] Int. Cl.[7] ................................................. H01L 29/72
[52] U.S. Cl. ............... 257/139; 257/328; 257/341; 257/370; 257/378; 257/401; 257/408; 257/411; 257/394
[58] Field of Search ...................... 257/139, 328, 257/341, 370, 378, 394, 401, 408, 411

[56] References Cited

U.S. PATENT DOCUMENTS 5,510,634 4/1996 Okabe et al. ...................... 257/139

FOREIGN PATENT DOCUMENTS

| 0 485 648 A1 | 5/1992 | European Pat. Off. . |
| 0 513 185 B1 | 11/1992 | European Pat. Off. . |
| 0 635 888 A1 | 1/1995 | European Pat. Off. . |
| 30 46 749 A1 | 9/1981 | Germany . |
| 32 01 545 A1 | 7/1983 | Germany . |

OTHER PUBLICATIONS

Patent Abstacts of Japan—58087874—May 25, 1983.

Modern Power Devices, Baliga, Jan. 1987, pp. 274–353.

Integrated Power Devices, Tihanyi, pp. 6–12, Dec. 1982, IEDM.

A High Performance Planar Power MOSFET, Coen et al., pp. 340–343, Feb. 1980, IEEE Transactions on Electron Devices.

*Primary Examiner*—Edward Wojciechowicz
*Attorney, Agent, or Firm*—Hill & Simpson

[57] ABSTRACT

A semiconductor component having a control structure for modulating the conductivity of a channel region wherein a small-area gate electrode of the proposed component covers the substrate only over a length $L_{gd} \approx L_{dep}$ ($L_{dep}$=width of the space-charge zone in the substrate). An auxiliary electrode conductively connected to the source metallization and extending up to the edge of the symmetry unit is embedded in the gate oxide and is arranged spaced from the gate electrode. It sees to a comparatively uniform field distribution in the edge region of the gate electrode and thus prevents the electrical field strength in the semiconductor from reaching the critical value of approximately $10^5$ V/cm that triggers surge ionization.

9 Claims, 2 Drawing Sheets

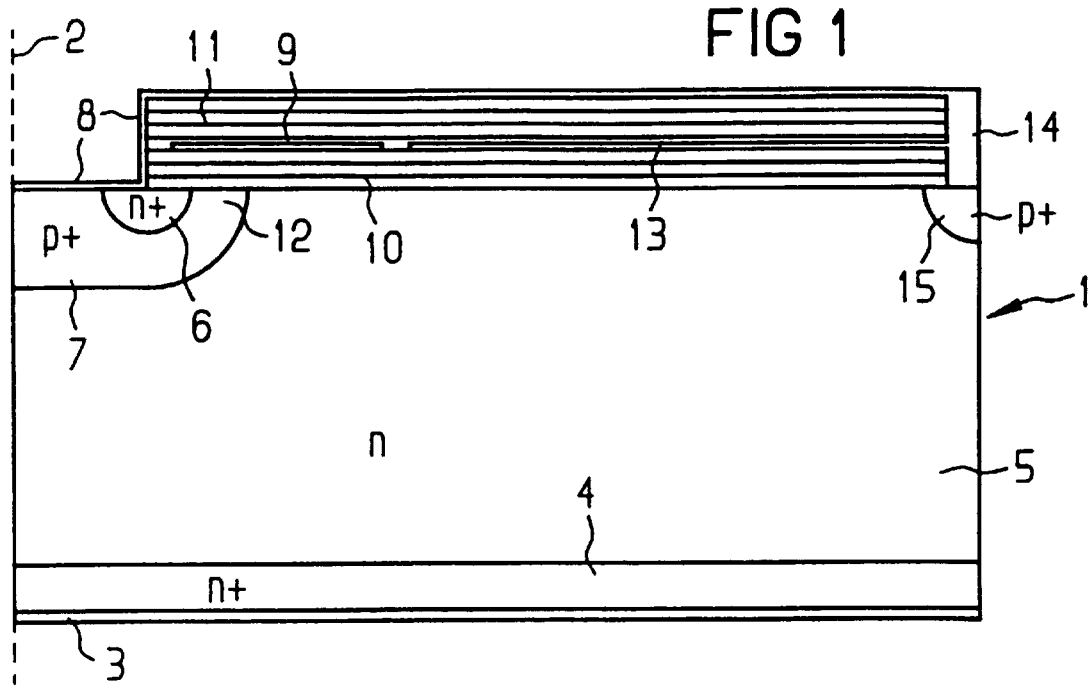
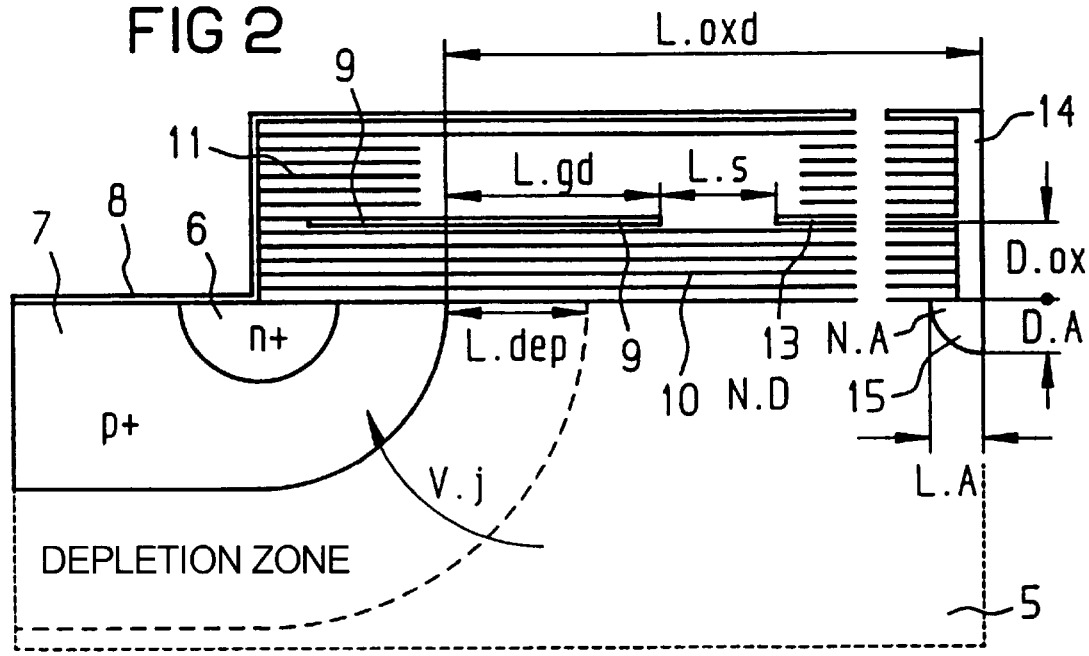

SEMICONDUCTOR COMPONENT WITH A CONTROL ELECTRODE FOR MODULATING THE CONDUCTIVITY OF A CHANNEL AREA BY MEANS OF A MAGNETORESISTOR STRUCTURE

BACKGROUND OF THE INVENTION

1. Field of the Invention

The present invention relates to an MOS-controlled semiconductor component having a structure that assures a good switching behavior of the component without deteriorating its static properties.

2. Description of the Prior Art

As voltage-controlled components, power MOSFETs do not require a control current in the stationary operating condition. Due to their structure, however, power MOSFETs contain comparatively large parasitic capacitances that must be charge-reversed at every switching event. Since these capacitances, which influence the switching behavior of the MOSFET, are composed of both metallizations and insulator layers, as well as of the space-charge zones forming in the region of the pn-junctions, their respective size depends on the applied voltage in a non-linear way.

In known MOS-controlled power semiconductors (MOSFETs, IGBTs), the reactance capacitance produced by tile gate electrode and the insulator of the gate-drain or of the gate-collector overlap area has a substantially disadvantageous effect on the switching behavior of the respective component and its switching environment (freewheeling branch). In particular, thus, the switching speed, the control performance, the rise rate, the dynamic strength and the dissipated power of the component are negatively influenced by the parasitic properties of the reactance capacitance.

The gate-drain or gate-collector overlap area and, thus, the reactance capacitance in MOS-controlled components can be made clearly smaller by a modification of the gate structure (see B. Jayant Baliga: *Modern Power Devices*, John Wiley & Sons (1987), pages 300 through 305). Although this measure improves the high-frequency behavior of the respective component, it also significantly deteriorates its breakdown strength (see *Modern Power Devices*, pages 274–276, particularly FIG. 6.10). Attempts to reduce the reactance capacitance with a thicker gate oxide without significantly lowering the blocking voltage were also unsuccessful.

SUMMARY OF THE INVENTION

Accordingly, the present invention is directed to, in particular, an MOS-controlled-semiconductor component having what is aimed at is a structure that assures a good switching behavior of the component without deteriorating its static properties. Despite a comparatively small reactance capacitance and the accompanying improvement of the dynamic properties, thus, the component should exhibit a high breakdown strength and, in particular, be employable in the field of power electronics.

The present invention enables the construction of power semiconductors (MOSFETs, IGBTs) with good dynamic and static properties. Due to the small reactance capacitance, the outlay for the drive and wiring of the components and, thus, their manufacturing or fabrication costs are considerably reduced.

Accordingly, in an embodiment of the present invention, a semiconductor component is provided having a control structure for modulating the conductivity of a channel region, wherein the semiconductor component includes: a semiconductor body having a first principal surface and a second principal surface, the first principal surface provided with the first electrode and the second principal surface at a control structure side of the semiconductor component provided with a semiconductor layer of a first conductivity type; a first semiconductor region of the first conductivity type and a second semiconductor region of a second conductivity type formed at a surface of the semiconductor layer on the control structure side, wherein a region of the second semiconductor region which lies between the first semiconductor region in a part of the semiconductor layer outside of the second semiconductor region is provided as a channel and is present at the surface of the semiconductor layer; a second electrode contacting the first and second semiconductor regions outside the region provided for the channel; a gate electrode arranged electrically insulated from the semiconductor layer and parallel to the surface of the semiconductor layer at the control structure side, the gate electrode covering at least the region provided for the channel; and a third electrode arranged electrically insulated from the gate electrode and parallel to the surface of the semiconductor layer at the control structure side at a lateral spacing from the gate electrode with respect to a plane of the surface as well as spaced from the first and second semiconductor regions and electrically insulated from the semiconductor layer at least in a region adjoining the gate electrode, wherein the second and third electrodes are electrically connected to one another or charged with a same potential.

In an embodiment, a third semiconductor region of the second conductivity type is formed at an edge side of the semiconductor layer and extending up to the surface thereof, the third semiconductor region being electrically connected to the second electrode.

In an embodiment, the gate electrode and the third electrode lie in the same plane oriented parallel to the structure side surface of the semiconductor layer.

In an embodiment, an electrical insulator is provided wherein the gate electrode and the third electrode are embedded into the electrical insulator and the second electrode covers at least a part of a surface of the electrical insulator.

In an embodiment, a gate electrode is formed of polycrystalline silicon.

In an embodiment, a region of electrically conducted material is embedded into the electrical insulator wherein the region conductively connects the second electrode to the third electrode.

In an embodiment, the region of electrically conductive material contacts the third semiconductor region of the semiconductor layer.

In an embodiment, the semiconductor body is doped of one of the first and second conductivity types.

In an embodiment, the gate electrode overlaps the semiconductor layer over a length which is substantially equal to a width of a space-charged zone in the semiconductor layer at a junction to the second semiconductor region given maximum conductivity-state current.

Additional features and advantages of the present invention are described, and will be apparent from, the Detailed Description of the Preferred Embodiments and the Description of the Drawings.

DESCRIPTION OF THE DRAWINGS

FIG. 1 shows a cross-sectional view of a symmetry unit of a MOSFET in accordance with the teachings of the present invention.

FIG. 2 shows a magnified portion of the symmetry unit shown in FIG. 1.

DETAILED DESCRIPTION OF THE PREFERRED EMBODIMENTS

Figure 3:
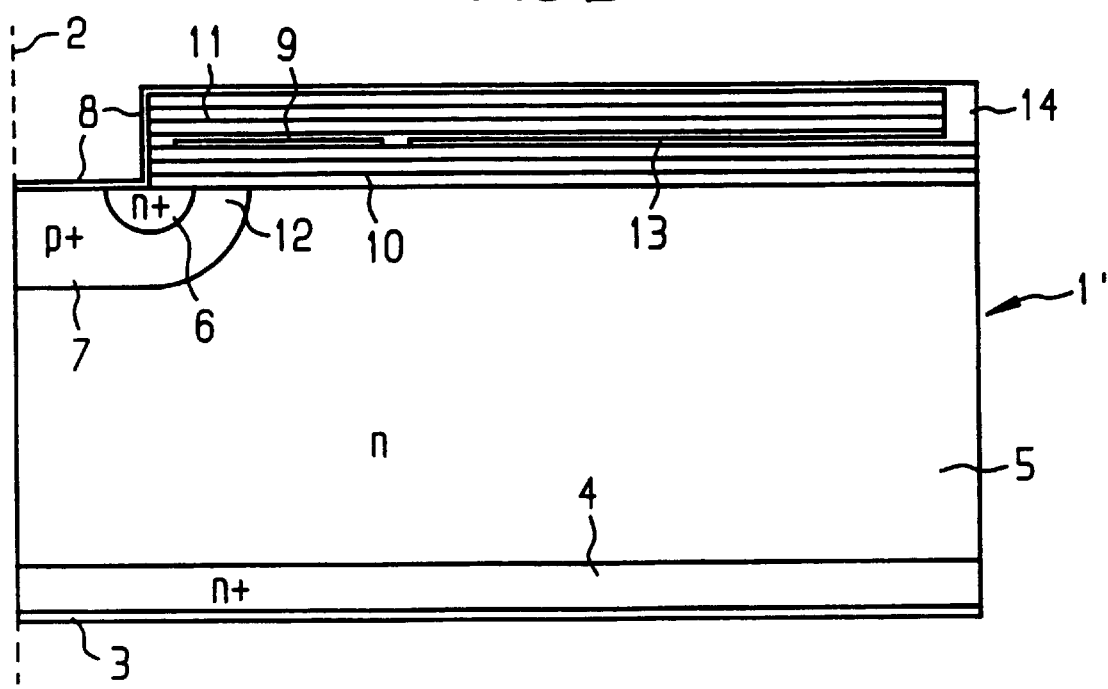
FIG. 3 shows a cross-sectional view of another symmetry unit of a MOSFET pursuant to the present invention.

FIGS. 1 and 2 show a cell 1 of a vertical n-channel MOS field effect transistor; the said cell 1 being fashioned, for example, circular, quadratic or hexagonal in the plane oriented perpendicular to the axis 2 and being mirror-symmetrically constructed relative to the axis 2. The individual transistor cells 1 are connected parallel in order to increase the current-carrying capability of the system. The electric strength of the structure is dependent on the dopant concentration and thickness of the Si epitaxial layer 5 deposited on the low-impedance, n$^+$-doped substrate (n-buffer) 4 that is provided with the drain metallization 3. The p$^+$-doped wells 7 of the transistor cells 1 are introduced in this n$^-$-doped layer 5, whereby each of the wells 7 contains an annular, n$^+$-doped source zone 6. An Al metallization 8 that contacts both the annular n$^+$-zone 6 as well as the respective p$^+$-well 7 serves as source electrode. The metallization 8 also conductively connects neighboring transistor cells to one another and circuits them parallel. The gate electrode 9—composed of polycrystalline silicon—is arranged between the thin gate oxide (SiO) and the oxide layer 11 carrying the source metallization 8. It covers both the channel 12 forming under the SiO$_2$ insulator 10 between the n$^+$-doped region 6 and the n-doped epitaxial layer 5 as well as parts of the epitaxial layer 5 over a length referenced L$_{gd}$ in FIG. 2. Since the length L$_{gd}$ defines the gate-drain overlap area and the latter, in turn, defines the size of the reactance capacitance, L$_{gd}$ should approximately satisfy the condition $$L_{gd} \approx L_{dep}$$

whereby L$_{dep}$ references the width of the space-charge zone of the p$^+$n-junction in the epitaxial layer 5 when the channel is formed and given maximum conducting-state current.

The electrode 13, which is arranged insulated from the gate 9 and is fabricated of polycrystalline silicon, covers the remaining area of the epitaxial layer 5 up to the edge of the transistor cell 1. Via a web 14 of polycrystalline silicon introduced into the oxide layers 10/11 or via an aluminum-filled hole, the electrode 13 is conductively connected both to the source metallization 8 as well as to the p$^+$-doped region 15 lying in the edge region of the cell 1. The electrode 13 fashioned annularly or frame-shaped sees to a comparatively uniform field distribution in the edge region of the gate electrode 9 and prevents the electrical field strength in the semiconductor material from reaching the critical value of approximately $10^5$ that triggers surge ionization and, thus, electron multiplication.

The p$^+$-doped region, preferably fashioned punctiform, dissipates the holes that always arise in the epitaxial layer 5. Therefore, a comparatively small, positive accumulation charge can form at the boundary surface gate oxide 10 and the semiconductor layer 5 under the electrode 13 that lies at source potential; i.e., that is negatively biased relative to the drain metallization 3. The electrical field resulting therefrom in the gate oxide 10, however, is always below the SiO$_2$ breakdown field strength.

Table I recites the preferred structural sizes and dopant concentrations of the semiconductor regions of a power MOSFET (600 V blocking voltage, nominal current density ≈50 A/cm$^2$; see FIG. 2). If the MOSFET is to exhibit different power data, it is especially the parameter L$_{gd}$ that must be correspondingly adapted in order to assure an optimum transmission and switching characteristic of the component. Although a short length L$_{gd}$ fundamentally improves the switching properties, it simultaneously deteriorates the transmission properties. It must also be noted that the spacing L$_s$ between gate electrode 9 and auxiliary electrode 13 influences the field distortion in the area of the electrode ends and L$_s$ should therefore be as small as possible. The dopant concentration N$_A$ of the edge region 15 is determined by the charge that the region 15 serving as a contact contributes to the acceptance of the electrical field up to the breakdown of the entire semiconductor structure. Its dimensions L$_A$/D$_A$ are thereby to be selected such that the space-charge zone spreading from the p$^+$n-junction does not deteriorate or only insignificantly deteriorates the transmission properties of the transistor cell 1.

TABLE 1

Preferred Structural Sizes and Dopant Concentrations

| | Structure acc. FIG. 2 | Structure acc. FIG. 3 |
|---|---|---|
| L$_{oxd}$ | 16.5 · 10$^{-4}$ cm | 16.5 · 10$^{-4}$ cm |
| D$_{ox}$ | 0.12 · 10$^{-4}$ cm | 0.12 · 10$^{-4}$ cm |
| L$_s$ | 1.5 · 10$^{-4}$ cm | <1.5 · 10$^{-4}$ cm |
| N$_D$ | 2 · 10$^{14}$ cm$^{-3}$ | 2 · 10$^{13}$ cm$^{-3}$ |
| L$_{gd}$ | 7.5 · 10$^{-4}$ cm | 6 · 10$^{-4}$ cm |
| N$_A$ | 1 · 10$^{17}$ cm$^{-3}$ | |
| L$_A$ | <1 · 10$^{-4}$ cm | |
| D$_A$ | <1 · 10$^{-4}$ cm | |

According to Table I, the epitaxial layer 5 of the transistor cell shown in FIGS. 1 and 2 is highly doped at N$_D$=2·10$^{14}$ cm$^{-3}$. If one wishes to reduce the dopant concentration by an order of magnitude of, for example, N$_D$=2·10$^{13}$ cm$^{-3}$, the space-charge zone, given an unmodified structure of the cell 1, would spread very far from the p$^+$n-junction lying at the cell edge into the high-impedance layer 5. Consequently, it would highly deteriorate the transmission properties of the structure. On the other hand, the electrical field in a high-impedance layer 5 is comparatively weak, so that one can also forego the p$^+$-doped edge region 15. FIG. 3 shows a correspondingly constructed transistor cell 1' in crossection. In order to maximize the blocking properties of the cell 1', the length L$_{gd}$ should be selected as small as possible (see the values indicated in the right-hand column of Table I).

The present invention, of course, is not limited to the above-described exemplary embodiments. For example, it is thus possible to also employ the invention given IGBTs. This component differs from an MOSFET essentially only in that the substrate provided with the collector metallization includes a p-doping, an additional pn-junction injecting minority charge carriers into the epitaxial layer (n-base) arises as a result thereof, and the source electrode is replaced by an emitter terminal (see, for example, *Modern Power Devices*, pages 350–353).

Although the present invention has been described with reference to specific embodiments, those skilled in the art will recognize the changes made thereto without departing from the spirit and scope of the invention as set forth in the hereafter appended claims.

What is claimed is:

1. A semiconductor component having a control structure for modulating the conductivity of a channel region, the semiconductor component comprising:

a semiconductor body having a first principal surface and a second principal surface, the first principal surface provided with a first electrode and the second principal surface at a control structure side of the semiconductor component provided with a semiconductor layer of a first conductivity type;

a first semiconductor region of the first conductivity type and a second semiconductor region of a second conductivity type formed at a surface of the semiconductor layer on the control structure side, wherein a region of the second semiconductor region which lies between the first semiconductor region and a part of the semiconductor layer outside of the second semiconductor region is provided as a channel and is present at the surface of the semiconductor layer;

a second electrode contacting the first and second semiconductor regions outside the region provided for the channel;

a gate electrode arranged electrically insulated from the semiconductor layer and parallel to the surface of the semiconductor at the control structure side, the gate electrode covering at least a region provided for the channel; and a third electrode arranged electrically insulated from the gate electrode and parallel to the surface of the semiconductor layer at the control structure side at a lateral spacing from the gate electrode with respect to a plane of the surface as well as spaced from the first and second semiconductor regions and electrically insulated from the semiconductor layer at least in a region adjoining the gate electrode, wherein the second and third electrodes are electrically connected to one another or charged with a same potential.

2. A semiconductor component as claimed in claim 1, further comprising:

a third semiconductor region of the second conductivity type formed at an edge side of the semiconductor layer and extending up to the surface thereof, the third semiconductor region being electrically connected to the second electrode.

3. A semiconductor component as claimed in claim 1, wherein the gate electrode and the third electrode lie in the same plane oriented parallel to the structure surface of the semiconductor layer.

4. A semiconductor component as claimed in claim 1, further comprising:

an electrical insulator wherein the gate electrode and the third electrode are embedded into the electrical insulator and the second electrode covers at least a part of a surface of the electrical insulator.

5. A semiconductor component as claimed in claim 1, wherein the gate electrode is formed of polycrystalline silicon.

6. A semiconductor component as claimed in claim 4, further comprising:

a region of electrically conductive material embedded into the electrical insulator wherein the region conductively connects the second electrode to the third electrode.

7. A semiconductor component as claimed in claim 6, wherein a region of electrically conductive material contacts the third semiconductor region of the semiconductor layer.

8. A semiconductor component as claimed in claim 1, wherein the semiconductor body is doped of one of the first and second conductivity types.

9. A semiconductor component as claimed in claim 1, wherein the gate electrode overlaps the semiconductor layer over a length which is substantially equal to a width of a space-charged zone in the semiconductor layer at a junction to the second semiconductor region given maximum conductivity-state current.

* * * * *